United States Patent
Suhm et al.

(10) Patent No.: US 11,955,585 B2
(45) Date of Patent: Apr. 9, 2024

(54) METHOD FOR COATING CHIPS

(71) Applicant: COMMISSARIAT A L'ENERGIE ATOMIQUE ET AUX ENERGIES ALTERNATIVES, Paris (FR)

(72) Inventors: Aurélien Suhm, Grenoble (FR); Maxime Argoud, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 423 days.

(21) Appl. No.: 17/435,102

(22) PCT Filed: Mar. 2, 2020

(86) PCT No.: PCT/FR2020/050410
§ 371 (c)(1),
(2) Date: Aug. 31, 2021

(87) PCT Pub. No.: WO2020/183090
PCT Pub. Date: Sep. 17, 2020

(65) Prior Publication Data
US 2022/0149245 A1 May 12, 2022

(30) Foreign Application Priority Data
Mar. 12, 2019 (FR) .................................. 19 02486

(51) Int. Cl.
*H01L 33/44* (2010.01)
*G03F 7/11* (2006.01)
*G03F 7/16* (2006.01)

(52) U.S. Cl.
CPC ................ *H01L 33/44* (2013.01); *G03F 7/11* (2013.01); *G03F 7/162* (2013.01)

(58) Field of Classification Search
CPC ............. H01L 21/0335; H01L 21/0338; H01L 21/0277; H01L 21/0231; H01L 21/0273;
(Continued)

(56) References Cited

U.S. PATENT DOCUMENTS

| 2009/0236749 A1 | 9/2009 | Otremba et al. |
| 2011/0151623 A1 | 6/2011 | Takahashi |

(Continued)

FOREIGN PATENT DOCUMENTS

| FR | 3 031 242 A1 | 7/2016 |
| FR | 3 053 530 A1 | 1/2018 |
| JP | 2018/67659 A | 4/2018 |

OTHER PUBLICATIONS

International Search Report dated Jul. 15, 2020 in PCT/FR2020/050410 filed Mar. 2, 2020, 2 pages.
(Continued)

*Primary Examiner* — Samuel A Gebremariam
(74) *Attorney, Agent, or Firm* — Oblon, McClelland, Maier & Neustadt, L.L.P.

(57) ABSTRACT

A method for coating chips resting, by a rear face opposite to a front face, on a main face of a support substrate, and separated from each other by an inter-chip space, includes a step of forming a photosensitive coating film covering the front faces and the inter-chip spaces. The method further includes a first photolithographic sequence which comprises an insolation sub-step, and a dissolution sub-step. The sequence leads to a partial removal of the photosensitive coating film so as to maintain the film exclusively at the inter-chip spaces and, advantageously recessed relative to the front faces.

14 Claims, 4 Drawing Sheets

(58) Field of Classification Search
CPC ............. H01L 21/0274; H01L 21/0237; H01L 21/0465
See application file for complete search history.

(56) References Cited

U.S. PATENT DOCUMENTS

| | | |
|---|---|---|
| 2013/0328213 A1 | 12/2013 | Otremba et al. |
| 2015/0357256 A1 | 12/2015 | Suthiwongsunthorn et al. |
| 2017/0077007 A1 | 3/2017 | Suthiwongsunthorn et al. |
| 2017/0170373 A1 | 6/2017 | Peng et al. |
| 2018/0019376 A1 | 1/2018 | Pourquier |
| 2018/0166491 A1 | 6/2018 | Nagata et al. |
| 2018/0240726 A1 | 8/2018 | Suthiwongsunthorn et al. |
| 2019/0341417 A1 | 11/2019 | Nagata et al. |

OTHER PUBLICATIONS

Preliminary French Search Report dated Dec. 3, 2019 in French Patent Application No. 1902486 filed Mar. 12, 2019, 3 pages (with Translation of Category).

METHOD FOR COATING CHIPS

TECHNICAL FIELD

The invention relates to a method for coating chips transferred onto a support substrate. Particularly, the present invention relates to a method for coating chips allowing the integrity, for example the mechanical integrity, of said chips to be preserved.

In particular, the method according to the present invention is advantageously implemented for coating chips having a mechanical fragility with regard to the methods known from the prior art.

PRIOR ART

A chip coating method known from the prior art is illustrated in FIGS. 1a to 1d.

The coating method comprises a first step (FIG. 1a) of assembling the chips 11 on a main face of the support substrate 10. Particularly, the chips are assembled on the main face of the support by their rear face, opposite their front face, and are spaced from each other by spaces, called inter-chip spaces.

A second step, illustrated in FIG. 1b, comprises forming a coating film 12 for the chips, covering the front faces of said chips and the inter-chip spaces. The coating film may in particular comprise an epoxy composite material loaded with silica beads.

The second step is followed by a third step intended to expose contact areas 11a at the front face of the chips (FIG. 1c)

The third step comprises, in this regard, a step of thinning and planarizing the coating film. This step is generally implemented in order to allow carrying out subsequent micro-fabrication steps such as photolithography, deposition or else etching steps, or even transfer of other functional chips.

The thinning and planarization step in particular comprises mechanical abrasion of the coating film which, when it is completed, reaches the front face of the chips.

Finally, the method can comprise a fourth and final step of removing the support substrate and cutting at the inter-chip spaces.

This method known from the prior art is however not satisfactory.

Indeed, forming the coating film generally involves heating to temperatures of the order of 150° C., or even 200° C. which are not compatible with some types of chips, among which the organic light-emitting diodes, and more generally the devices made in organic electronics may be mentioned.

Moreover, a difference between the coefficients of thermal expansion of the support substrate and the coating film can generate, under the effect of this heating, constraints, and more particularly a detachment of the chips.

In order to overcome this problem, the coating films implemented in the method known from the prior art are generally composites including a polymer matrix, usually of the epoxy type, loaded with silica beads. However, due to the presence of these beads of known average diameter, this solution limits the reduction in size of the inter-chip space of the order of 500 μm (5 times the conventional average diameter of the beads).

Furthermore, the third step is capable of weakening, or even making inoperative, the chips when the latter have a low mechanical strength.

This is in particular the case when the chips comprise light-emitting devices, and more particularly light-emitting devices with microwires or nanowires as described in the document [1] mentioned at the end of the description.

Furthermore, the third step, as proposed in the method known from the prior art, does not allow keeping said coating film exclusively at the inter-chip spaces and, recessed relative to the front faces of the chips, without degrading said front faces.

A purpose of the present invention is therefore to propose a method for coating chips which allows uncovering the front face of the chips while preserving the integrity of the latter.

Another purpose of the present invention is to provide a method for coating chips present exclusively in an inter-chip space, and advantageously flush or recessed from the front face of said chips.

Another purpose of the present invention is to provide a method for coating the chips for which the thermal budget is reduced compared to the method known in the art.

Another purpose of the present invention is finally to provide a method for coating chips allowing the inter-chip space to be reduced.

DESCRIPTION OF THE INVENTION

The purposes of the present invention are, at least in part, achieved by a method for coating chips resting, by a rear face opposite to a front face, on a main face of a substrate, and separated from each other by an inter-chip space, the method comprising the following steps:
  a) a step of forming a photosensitive coating film covering the front faces and the inter-chip spaces,
  b) a first photolithographic sequence which comprises an insolation sub-step b1), and a dissolution sub-step b2), said sequence leading to a partial removal of the photosensitive coating film so as to maintain said film exclusively at the inter-chip spaces and, advantageously flush or recessed relative to the front faces.

It is understood, without it being necessary to specify it, that as soon as the chips rest on the main face of the support substrate, said chips are projecting relative to said main face.

In other words, the inter-chip space formed at the main face and between the chips is also recessed relative to the front faces of said chips.

The insolation sub-step b1) is carried out by means of a radiation, in particular a light radiation in the ultraviolet range. This insolation step, depending on the tone of the photosensitive coating film (the tone can be positive or negative), allows, within said film, discriminating, in terms of solubility, the first regions, directly below the front faces, from the second regions covering the inter-chip spaces. Particularly, step b1) is executed so that the first regions are soluble in a given solvent, and that the second regions resist the latter.

Thus, the method according to the present invention allows uncovering the front faces, and maintaining the photosensitive coating film only at the inter-chip spaces, without applying a mechanical force to the chips. The method according to the present invention therefore allows preserving the mechanical integrity of the chips, and can, in this regard, be implemented to coat chips having on their surface elements (material and/or structure) having a low mechanical strength.

Moreover, it is also possible, according to this method, to form a coating, only at the inter-chip spaces, and flush or recessed relative to the front face of the chips. It is thus possible to proceed with the execution of additional manufacturing steps on a relatively flat surface, in particular when the coating is flush with the front faces in chips.

In other words, at the end of step b), the thickness of the photosensitive coating film at the inter-chip spaces is less than or equal to a height H measured between the front face and the main face.

A height H measured between two essentially parallel faces corresponds to the shortest distance between the two faces.

Such a result cannot be obtained via a method involving thinning by mechanical abrasion.

According to one embodiment, the method further comprises a step of creeping the photosensitive coating film, advantageously executed between steps a) and b), or after step b).

According to one embodiment, forming the photosensitive coating film comprises applying, under vacuum, a dry film made of a photosensitive material, preferably by vacuum laminating.

Forming the coating film according to this embodiment allows filling the entire inter-chip space by limiting, or even eliminating, the formation of voids at the inter-chip spaces.

Moreover, according to this embodiment, the temperatures involved of a hundred degrees Celsius allow maintaining the integrity of temperature-sensitive materials (for example organic materials) as well as limiting the relative expansion since the chip and the substrate are each made of materials having a different coefficient of thermal expansion.

Moreover, the film implemented is preferably not loaded, in particular with silica beads (conventional photosensitive resin), it is possible to consider a narrowing of the inter-chip space.

According to one embodiment, forming the photosensitive coating film comprises spreading a liquid material by spin coating.

According to one embodiment, forming the photosensitive coating film comprises spraying a liquid material in the form of droplets.

According to one embodiment, the photosensitive coating film has a Young's modulus of an order of magnitude from 100 to 100 000 times less than that of the support substrate.

Thus, the constraints likely to be imposed by the photosensitive coating film are not such as to generate detachment of the chips at the main surface.

According to one embodiment, the photosensitive coating film has a negative tone, and, at the end of step a), is of a thickness E less than or equal to a height H measured between the main face and the front face of a chip.

A film of negative tone (negative tone) allows during insolating said film at the inter-chip space crosslinking said film, and consequently maintaining a more chemically stable film at the inter-chip space.

According to one embodiment, the photosensitive coating film has a positive tone.

According to one embodiment, at the end of step a), the photosensitive coating film is of a thickness E less than or equal to a height H measured between the main face and the front face of a chip.

According to one embodiment, at the end of step a), the photosensitive coating film is of a thickness E greater than a height H measured between the main face and the front face of a chip.

According to one embodiment, the sub-step b1) is executed so that at the end of the sub-step b2), the photosensitive coating film remaining at the inter-chip spaces is recessed relative to the front faces.

According to one embodiment, the method also comprises a step c) of opening contacts on the main face at the inter-chip spaces.

According to one embodiment, step c) comprises a second photolithographic sequence.

According to one embodiment, the chips comprise light-emitting devices.

According to one embodiment, the light-emitting devices comprise nanowires or microwires projecting relative to the front face.

According to one embodiment, the control circuit comprises control circuits intended to interconnect the chips or as a control circuit for the chip.

BRIEF DESCRIPTION OF THE DRAWINGS

Other features and advantages will become apparent in the following description of the chip coating method according to the invention, given by way of non-limiting examples, with reference to the appended drawings wherein.

DETAILED DESCRIPTION OF PARTICULAR EMBODIMENTS

The invention relates to a chip coating method involving forming a photosensitive coating film and implementing a photolithography sequence intended to uncover the front faces of the chips.

This method, unlike the methods known from the prior art, does not implement mechanical abrasion of the coating film so that the mechanical integrity of the chips is preserved.

It is thus possible, according to the present invention, to proceed with a coating of chips called fragile chips, and which would not resist the effects of a mechanical abrasion.

FIGS. 2a-2d and 3a-3d show the different steps of the chip coating method according to the present invention.

Figure 1A:
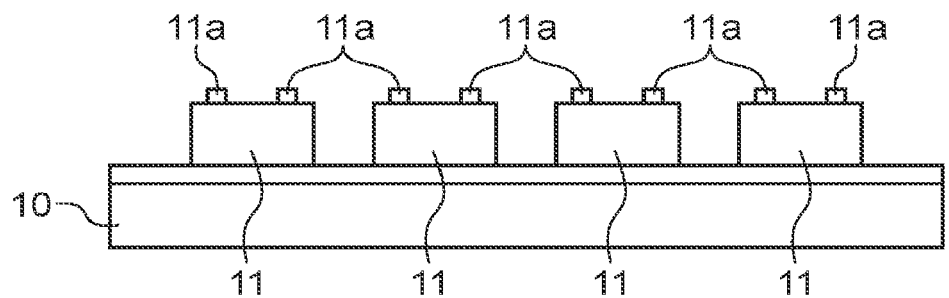
FIGS. 1a to 1c are schematic representations of the steps of a chip coating method according to a method known from the prior art, the different views relating to this method show the chips and/or the support substrate along a section plane perpendicular to the first face of the support substrate and/or to the front face of the chips.
Figure 1B:
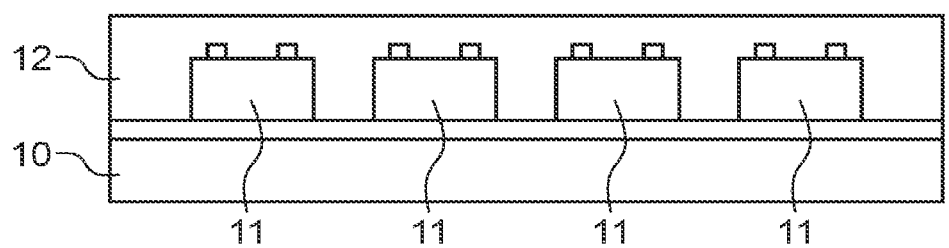
Figure 1C:
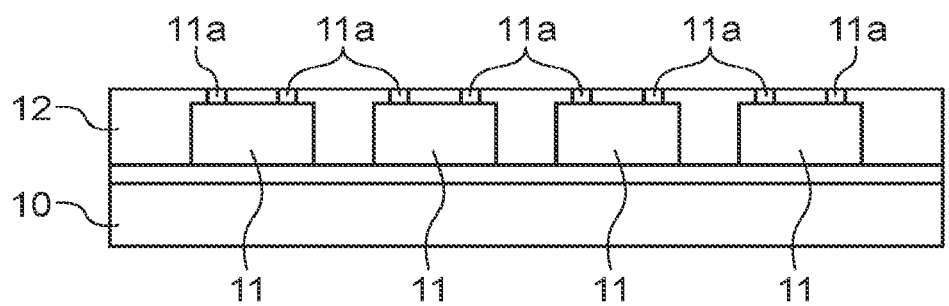
Figure 2A:
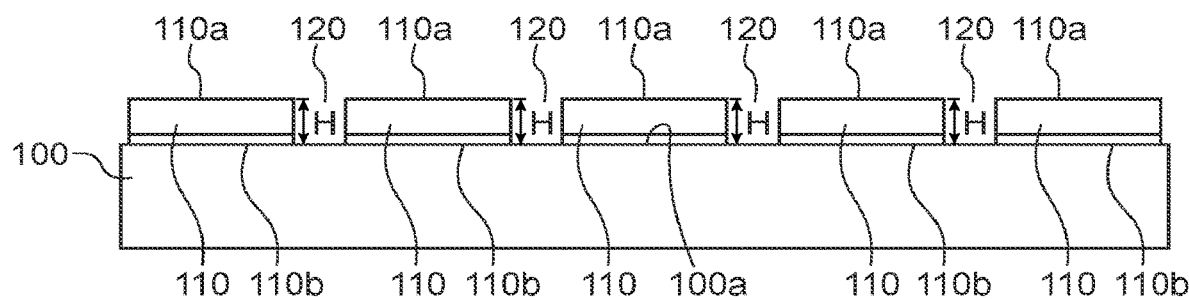
FIGS. 2a to 2d are schematic representations of the steps of a chip coating method according to a first variant of the present invention, the different views relating to this method show the chips and/or the support substrate along a section plane perpendicular to the main face of the support substrate and/or to the front face of the chips, this first variant implements a negative tone photosensitive coating film.
Figure 3A:
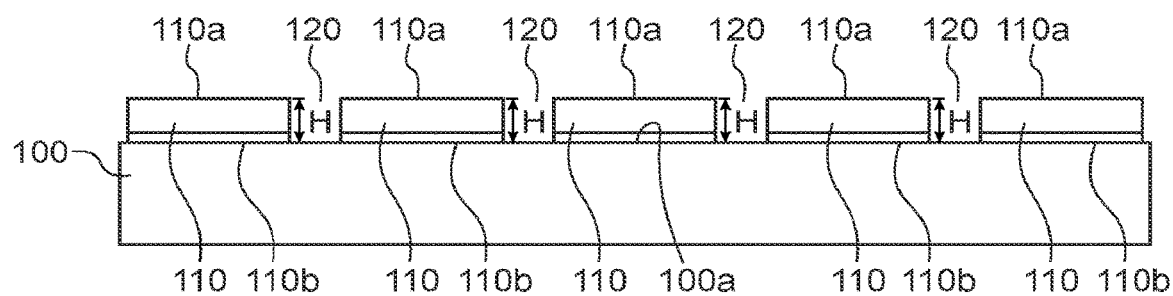
FIGS. 3a to 3d are schematic representations of the steps of a chip coating method according to a second variant of the present invention, the different views relating to this method show the chips and/or the support substrate along a section plane perpendicular to the main face of the support substrate and/or to the front face of the chips, this second variant implements a positive tone photosensitive coating film.

The method comprises in particular the provision of a support substrate 100 on one face of which, called main face 100a, the chips 110 rest, by their rear face 110b (FIGS. 2a and 3a).

The chips 110 also comprise a front face 110a opposite the rear face 110b.

The chips 110 can be arranged on the main face 100a in a matrix manner.

"Matrix arrangement", means a mesh with N lines and M columns.

The chips 110 may have been collectively or individually transferred on the support substrate 100.

The transfer techniques are known to the person skilled in the art and are not described in more detail in the following statement.

The support substrate 100 may comprise a semiconductor material, an insulating material.

For example, the support substrate 100 may comprise silicon on one face of which (in particular the main face 100a) are formed microelectronic devices. The micro electronic devices can in particular comprise control circuits intended to be interconnected with the chips 110.

In particular, each control circuit can be paired (or interconnected) with one or more chip(s) 110. In this case, the one or more chip(s) 110 rest(s) on said control circuit. In other words, the arrangement of the chips 110 on the main face 100a of the support substrate 100 reproduces the arrangement of the control circuits.

The chips 110 resting on the main face 100a are distant from each other, and therefore separated from each other, by an inter-chip space 120.

It is understood, without it being necessary to specify it, that as soon as the chips 110 rest on the main face 100a of the support substrate 100, said chips 110 are projecting relative to said main face 100a.

In other words, the inter-chip space formed at the main face 100a and between the chips 110 is also recessed relative to the front faces 110a of said chips 110. Particularly, said recess corresponds to a height H measured between the main face 100a and the front face 110a.

Figure 2B:
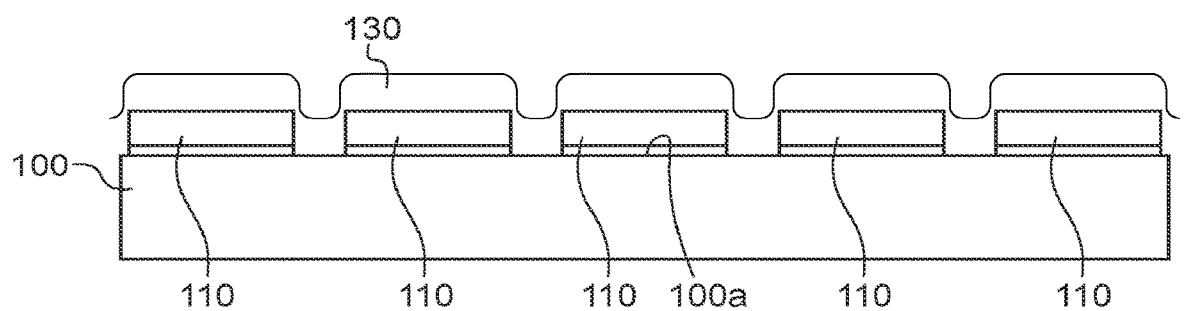
Figure 3B:
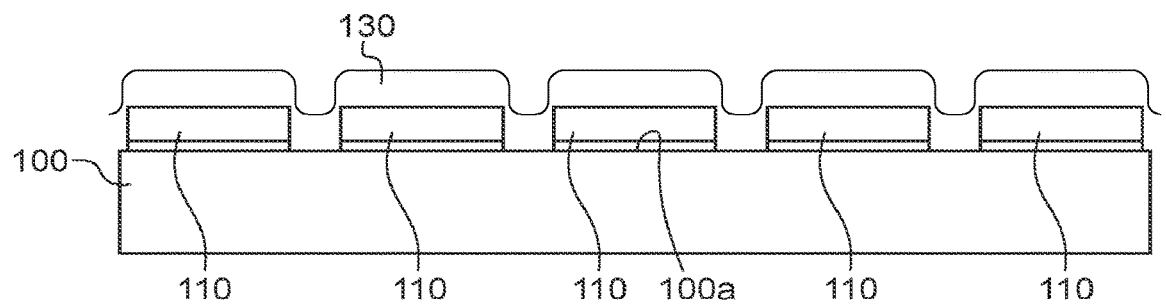

The method according to the present invention comprises a step a) of forming a photosensitive coating film 130 covering the front faces 110a and the inter-chip space 120 (FIGS. 2b and 3b).

"Photosensitive coating film" means a film on which it is possible to delimit patterns by a photolithographic sequence. A photolithographic sequence, according to the terms of the present invention, comprises an insolation, in particular an insolation to a radiation, for example light radiation, of specific regions through a mask, as well as a dissolution step.

According to a first example, step a) of forming the photosensitive coating film 130 may in particular comprise an application, under vacuum, of a dry film made of a photosensitive material. This formation can be made by lamination for example.

"Under vacuum" means a pressure less than $1 \cdot 10^4$ Pa.

The dry film may in particular comprise a film of the "MX5000 series" type sold by the company Dupont®.

However, the invention is not limited to this example, and a person skilled in the art can select other photosensitive dry films and implement them to carry out the present invention.

This method for applying a film under vacuum is relatively conformal, and also allows limiting the formation of voids. In other words, the photosensitive coating film faithfully conforms to the topology imposed by the chips 110.

Moreover, a moderate heating, for example to a temperature less than 120° C., can also be imposed during application of the dry film.

Furthermore, an unloaded photosensitive coating film allows considering a reduction in the inter-chip spaces 120.

According to a second example, step a) of forming the photosensitive coating film 130 may comprise spreading a photolithographic resin by spin coating.

According to a third example, step a) of forming the photosensitive coating film 130 can comprise spreading a photolithographic resin by spraying ("spray coating") in the form of droplets of said resin. Still according to this third example, spraying in the form of droplets can advantageously be replaced by the use of a doctor blade or a slot die.

The photolithographic resin may comprise a negative tone resin or a positive tone resin.

For example, a negative tone resin can comprise at least one of the elements selected from: "MX5000 series" and "WBR series" sold by the company Dupont, "SINR series" sold by the company ShinEtsu, "LQC series" sold by the company ECSC, "THB N series" sold by the company JSR Micro, "AL-X2000 series" sold by the company AGC, "LTC9300 series" sold by the company Fujifilm, "SU8 series" sold by the company MicroChem.

Equivalently, a positive tone resin can comprise at least one of the elements selected from: "THB P series" and "PFR IX series" sold by the company JSR Micro, "4500 series" sold by the company AZ, "TELR series" sold by the company TOK.

The material forming the photosensitive coating film can have a Young's modulus of an order of magnitude from 100 to 100 000 times less than that of the support substrate 100.

The method according to the present invention also comprises the execution of a first photolithographic sequence b) (FIGS. 2c, 2d, 3c and 3d).

The first photolithographic sequence in particular comprises:
b1) a sub-step of insolation to a radiation R through a mask M, and
b2) a sub-step of selective dissolution of first portions 130a of photosensitive coating film 130 directly above the front faces 110a.

Thus, the first photolithographic sequence leads to a partial removal of the photosensitive coating film, particularly of the first portions 130a, so as to maintain second portions 130b of said film exclusively at the inter-chip spaces 120.

The first photolithographic sequence can advantageously be executed so that at the end of said sequence the film 130, the second portions 130b are recessed relative to the front faces 110a. In other words, the second portions 130b have a thickness less than the height H.

In this regard, the photolithographic coating film may, at the end of step a), have a thickness E less than the height H.

Alternatively, the thickness of the second portions 130b, of a positive tone photosensitive coating film, can also be controlled by focusing the insolation radiation during the execution of the sub-step b1). Particularly, FIGS. 4a and 4b are schematic representations, respectively of the step a) and of the sub-step b1).

Figure 4A:
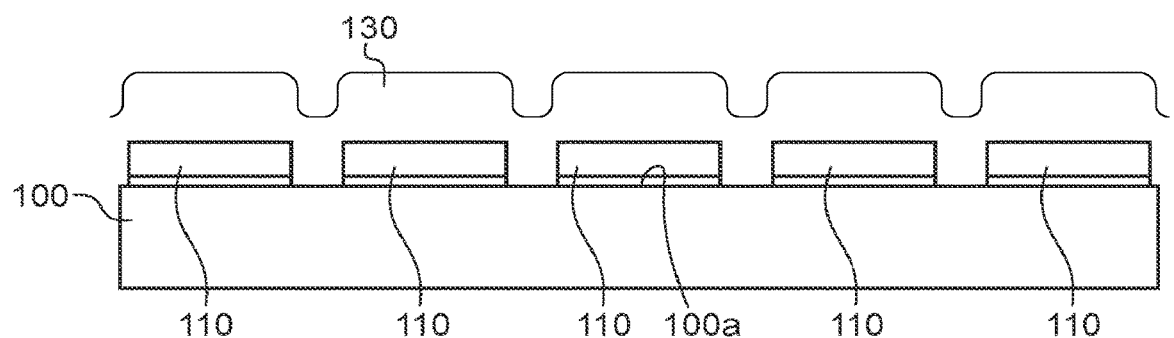
FIGS. 4a and 4b are schematic representations, respectively, of an exemplary embodiment of the step a) and the sub-step b1) involving a positive tone photosensitive coating film and a thickness greater than the height H.

FIG. 4a illustrates in particular a step of forming a positive tone photosensitive coating film covering the front faces 110a and the inter-chip spaces. The thickness of said film is greater than the height H.

This film can be obtained by applying, under vacuum, one or more dry film(s) so as to achieve the desired thickness.

Figure 4B:
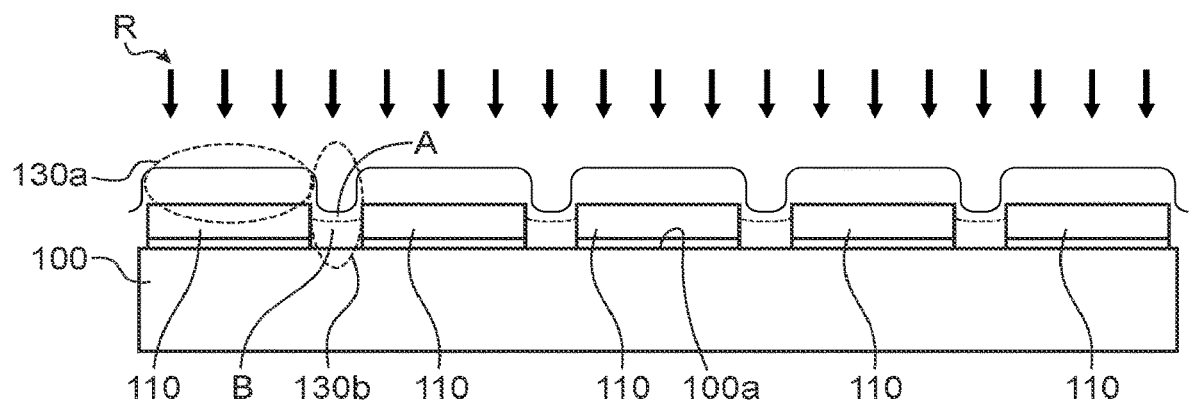

The sub-step b1), illustrated in FIG. 4b, can then be executed by focusing the light radiation at the first portions 130a and an upper section A of the second portions 130b (FIG. 4b) of the photosensitive coating film so that only a lower section B (inserted between the upper section A and the main face 100a) of the second portions 130b is resistant to the dissolution executed during sub-step b2). This result is obtained for both a coating film conforming and not conforming to the surface on which it rests.

Figure 2C:
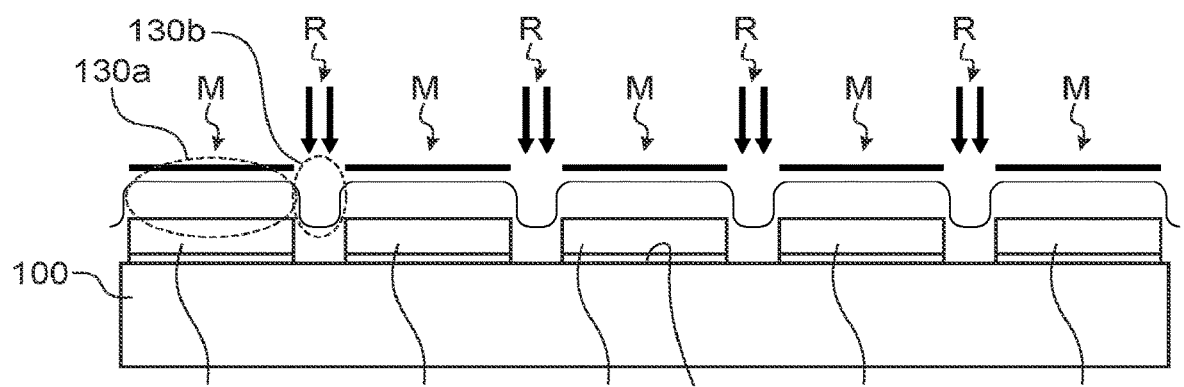
Figure 2D:
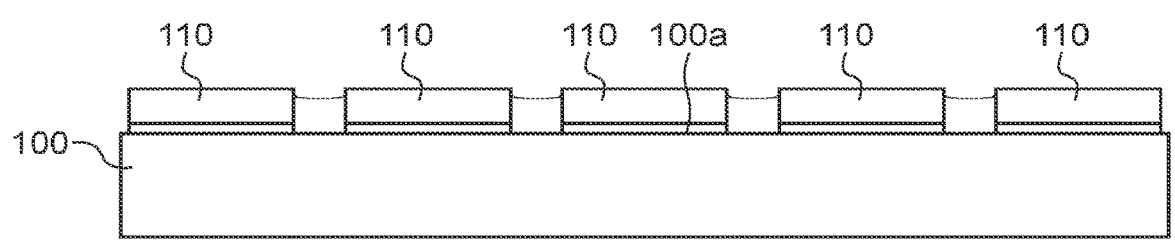
Figure 3C:
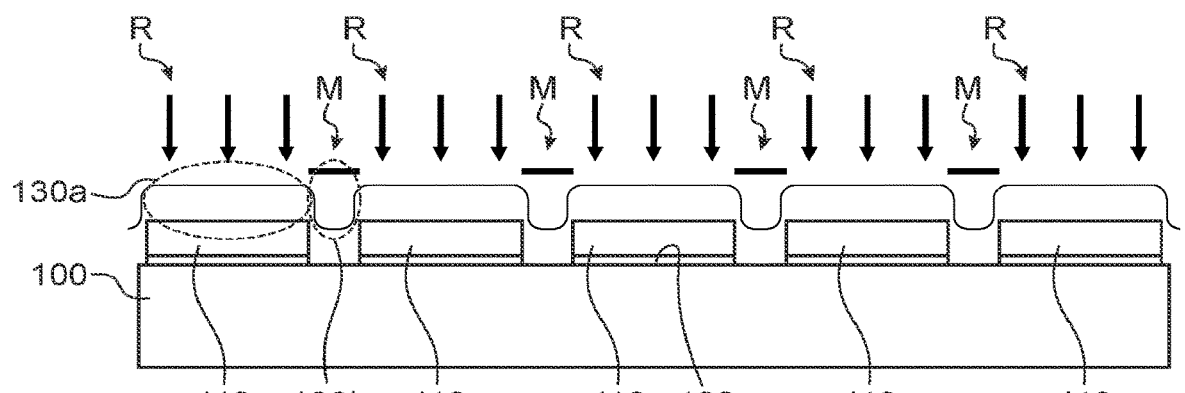
Figure 3D:
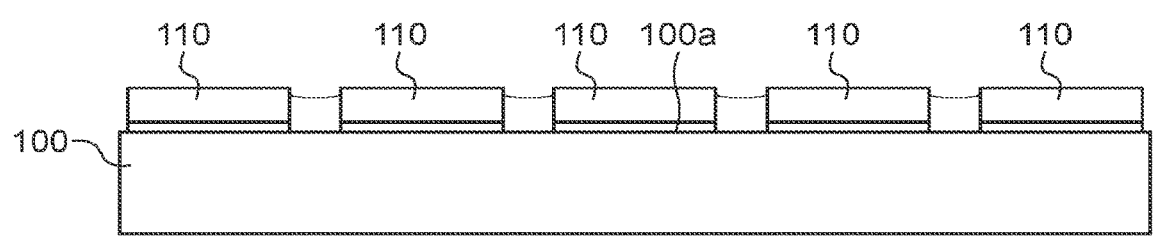

The insolation sub-step b1) can be carried out by means of a light radiation R, in particular a light radiation in the ultraviolet range, projected onto the photosensitive coating film through a photolithographic mask M (FIGS. 2c and 3c). This insolation step, depending on the tone of the photosensitive coating film (the tone can be positive or negative), allows, within said film, discriminating in terms of solubility the first regions directly above the front faces, from the second regions covering the inter-chip spaces. Particularly, the step b1) is executed so that the first regions are soluble in a given solvent, and that the second regions resist the latter.

Thus, the method according to the present invention allows uncovering the front faces, and maintaining the photosensitive coating film only at the inter-chip spaces, without applying a mechanical force to the chips 110. Therefore, the method according to the present invention allows preserving the mechanical integrity of the chips 110, and can, in this regard, be implemented to coat chips 110 having a low mechanical strength.

Particularly, a negative tone photosensitive coating film (FIG. 2c) implies during the execution of step b1) to insulate the second regions 130b so as to make the latter resistant to the dissolution of the sub-step b2). In other words, the photolithographic mask must mask the first regions 130a and allow the insolation of the second regions 130b.

Conversely, a positive tone photosensitive coating film (FIG. 3c) implies during the execution of step b1) to insulate the first regions 130a so as to make the latter sensitive to the dissolution of the sub-step b2). In other words, the photolithographic mask must mask the second regions 130a and allow the insolation of the first regions 130b.

Figure 5A:
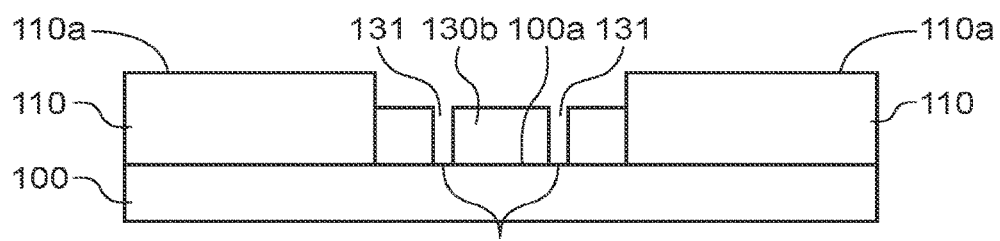
FIGS. 5a and 5b are schematic representations illustrating the contact at the inter-chip space.

The implementation of a positive tone photosensitive coating film advantageously allows opening contacts 140 on the main face 100a at the inter-chip spaces 120 (FIG. 5a).

The contact opening can in particular be executed according to a second photolithographic sequence intended to form openings 131 at the second regions 130b. The openings 131 are in particular through openings and allow access to the contacts 140 on the main face 100a at the inter-chip spaces 120.

Figure 5B:
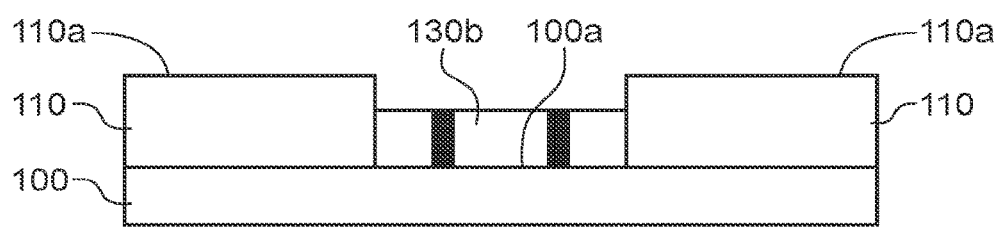

Forming the openings can also be followed by a step of filling said openings with a metallic species, in particular copper deposited by an electrodeposition method (FIG. 5b).

The method can also comprise at least one step of creeping the photosensitive coating film.

"Creeping" means a heat treatment which comprises a rise in temperature, in particular at a temperature higher than the glass transition temperature of the considered material.

This creeping step can be carried out immediately after step a).

Alternatively or additionally, the creeping step can be executed after step b). Under these conditions, the creeping step allows correcting faults likely to appear after step b). These faults can in particular be due to an improper sizing of the photolithographic mask M or to its misalignment.

During the execution of the method according to the present invention, the mechanical stresses exerted on the chips are limited so that the mechanical integrity of the latter is preserved.

Moreover, the method allows fully uncovering the front face of the chips in order to carry out subsequent steps at said faces.

Consequently, the method is particularly adapted for the coating of chips comprising light-emitting devices at their front face.

In particular, the light-emitting devices can be light-emitting devices with nanowires or microwires projecting relative to the front face such as those described in the document [1] mentioned at the end of the description.

The following description gives an example of implementation of the method according to the present invention carried out by the inventors.

According to this example, each of the chips comprise on their front face, a matrix of pixels of GaN nanowires with a micrometric diameter and an approximate height of 10 μm.

Each chip can be hybridised, by an interconnection layer with a thickness of about 15 μm on the main face of the support substrate. Particularly, the hybridisation is carried out at a control circuit (for example a CMOS control circuit) formed on the main face of the support substrate.

The chips can be square in shape, the side of which measures about 21.2 mm, and disposed on the front face in a pitch of 22 mm (in other words, the inter-chip space measures about 800 μm).

Two dry photosensitive films of negative polarity ("MX5000 series" sold by the company Dupont®), and of 15 microns thick, are applied successively by vacuum laminating, on the front faces and the inter-chip space. This embodiment of step a) allows limiting, or even avoiding, the presence of voids.

Step b1) comprises insolating, for example with ultraviolet radiation, the second regions.

Step b2) comprises dissolving the first regions with a chemical solution that comprises 0.75% $K_2CO_3$.

Measurements carried out with a mechanical profilometer after each of the steps have allowed to demonstrate that at the end of step b2), the photosensitive coating film remains exclusively in the inter-chip space, and is recessed relative to the front faces.

REFERENCES

[1] FR 3053530

The invention claimed is:

1. A method for coating chips resting, by a rear face of the chips opposite to a front face of the chips, on a main face of a support substrate, the chips being separated from each other by an inter-chip space, the method comprises:
   a) forming a photosensitive coating film covering the front faces and the inter-chip spaces, the photosensitive coating film having either a negative tone or a positive tone, and, at the end of step a), is of a thickness E less than or equal to a height H measured between the main face and the front face of a chip,
   b) a first photolithographic sequence which comprises an insolation b1), and a dissolution b2), said first photolithographic sequence leading to a partial removal of the photosensitive coating film so as to maintain said photosensitive coating film exclusively at the inter-chip spaces.

2. The method according to claim 1, wherein during the first photolithographic sequence, the first photolithographic sequence leads to the photosensitive coating film flush or recessed relative to the front faces.

3. The method according to claim 1, wherein the method further comprises creeping the photosensitive coating film.

4. The method according to claim 3, wherein the creeping the photosensitive coating film is executed between the forming a photosensitive coating film and the first photolithographic sequence or after the first photolithographic sequence.

5. The method according to claim 1, wherein forming the photosensitive coating film comprises applying, under vacuum, a dry film made of a photosensitive material.

6. The method according to claim 5, wherein during the forming the photosensitive coating film, the applying under the vacuum of the dry film made of a photosensitive material is made by vacuum laminating.

7. The method according to claim 1, wherein forming the photosensitive coating film comprises spreading a liquid material by spin coating.

8. The method according to claim 1, wherein forming the photosensitive coating film comprises spraying a liquid material in the form of droplets.

9. The method according to claim 1, wherein the photosensitive coating film has a Young's modulus from 100 to 100,000 times less than that of the support substrate.

10. The method according to claim 1, wherein the photosensitive coating film is of a positive tone, and the method also comprises c) opening contacts on the main face at the inter-chip spaces.

11. The method according to claim 10, wherein the opening contacts on the main face at the inter-chip spaces comprises a second photolithographic sequence.

12. The method according to one of claim 1, wherein the chips comprise light-emitting devices.

13. The method according to claim 12, wherein the light-emitting devices comprise nanowires or microwires projecting relative to the front face.

14. The method according to claim 1, wherein a control circuit comprises control circuits intended to interconnect the chips to control them.

* * * * *